United States Patent
Brown et al.

(10) Patent No.: US 6,745,146 B1
(45) Date of Patent: Jun. 1, 2004

(54) AUTOMATED TEST SYSTEM AND METHOD FOR DEVICE HAVING CIRCUIT AND GROUND CONNECTIONS

(75) Inventors: Edwin Zane Brown, Westminster, CO (US); Roger Alan Merriman, Lakewood, CO (US); Steven Todd Brandenburg, Broomfield, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 696 days.

(21) Appl. No.: 09/183,214

(22) Filed: Oct. 30, 1998

(51) Int. Cl.[7] .................. G01M 19/00; G06F 19/00
(52) U.S. Cl. .............. 702/123; 702/122; 702/119; 702/120
(58) Field of Search .............. 702/57–59, 64, 702/65, 116–120, 122, 123; 324/500, 509–11, 764, 771; 714/25, 46

(56) References Cited

U.S. PATENT DOCUMENTS

| | | | | |
|---|---|---|---|---|
| 4,168,527 A | * | 9/1979 | Winkler ............... | 702/118 |
| 4,310,836 A | * | 1/1982 | Stanzani ............... | 340/556 |
| 4,315,309 A | * | 2/1982 | Coli ..................... | 705/3 |
| 5,751,606 A | * | 5/1998 | Migachyov et al. ..... | 700/282 |
| 6,011,398 A | * | 1/2000 | Bald et al. ............. | 324/511 |
| 6,054,865 A | * | 4/2000 | Bald et al. ............. | 324/551 |
| 6,094,624 A | * | 7/2000 | Chao .................... | 702/117 |

OTHER PUBLICATIONS

VITREK 944i Dielectric Analyzer, Operating and Maintenance Manual, Copyrighted Jan. 1992, 1993, 1994 Vitrek Corporation.

* cited by examiner

*Primary Examiner*—Marc S. Hoff
*Assistant Examiner*—Manuel L Barbee
(74) *Attorney, Agent, or Firm*—Sheridan Ross P.C.

(57) ABSTRACT

An automated test system for testing a device under test includes a storage device, an input device, a processor, and a test apparatus. The storage device is operable to store a plurality of sets of test parameters, and is further operable to store a plurality of product model identifiers, each product model identifier associated with one of the plurality of sets of test parameters. The input device is operable to obtain input from an operator defining a first product model identifier from the plurality of product model identifiers. The processor is coupled to the input device and the storage device and is operable to receive the input from the input device and retrieve the set of test parameters associated with the first product model identifier from the storage device based on the input. The processor is further operable to generate a control signal that includes the retrieved set of test parameters. The test apparatus includes a first connection operable to be connected to the circuit connection of the device and a second connection operable to be connected to the ground connection of the device. The test apparatus is further operably connected to receive the control signal including the retrieved set of test parameters from the processor. The test apparatus is operable to perform a first test based on the first set of test parameters.

12 Claims, 5 Drawing Sheets

AUTOMATED TEST SYSTEM AND METHOD FOR DEVICE HAVING CIRCUIT AND GROUND CONNECTIONS

CROSS REFERENCE RELATED APPLICATIONS

Cross Reference is made to co-pending U.S. Patent Application Ser. No. 09/183,208, filed Oct. 30, 1998.

FIELD OF THE INVENTION

The present invention relates generally to test systems and methods, and in particular, to test systems and methods used in testing devices having circuit and ground connections for receiving power from external sources.

BACKGROUND OF THE INVENTION

Devices that derive electrical power from external sources, such as utility power, typically include a circuit connection and a ground connection for connecting to the external power source. Such devices include, among other things, consumer appliances, industrial equipment, and computer equipment. The circuit connection in such devices generally includes two contact points across which the device is connected to complete the power circuit. The ground connection in the device is intended to be connected to a electrical ground. According to many international safety standards, the ground connection must also electrically connect the metal chassis of the device to electrical ground.

Several international standards define tests relating to the electrical interconnection and/or isolation of the circuit connection, the ground connection, and the metal chassis of an electrical device. Such test are referred to herein as electrical safety compliance tests. Two common electrical safety compliance tests are those generally referred to as the dielectric withstand test, and the ground continuity test. Electrical devices must typically pass such tests before being sold commercially.

The dielectric withstand test measures the isolation between the circuit connection and the ground connection at high voltages. To this end, a high voltage typically exceeding 1000 volts AC or DC is applied across the circuit connection and the ground connection of the device. The current is then measured. If the current exceeds a maximum allowable current threshold, the isolation between circuit and ground connection of the device is considered to be insufficient. If the isolation between the circuit and ground connection is insufficient, high voltages may propagate to the metal chassis during operation of the device, thereby creating a potential safety hazard.

The ground continuity test measures the resistance between the ground connection and the device chassis. The ground continuity test assures that the metal chassis will be electrically grounded during normal operation of the device. If a high resistance is detected, the chassis may not be properly grounded, thereby creating a potential shock hazard.

One problem associated with performing the dielectric withstand test and the ground continuity test is that many countries have unique test requirements. While the type of tests are generally the same from country to country, the specific test parameters vary. For example, the U.S. standards body, UL, defines two alternative dielectric withstand tests. One UL dielectric withstand test requires that a product be able to withstand application of 1500 volts AC for one minute. Another UL dielectric withstand test requires that a device be able to withstand application of 1725 volts DC for one second. By contrast, the United Kingdom standards body, BABT, requires that a device be able to withstand 2800 volts AC for one minute or 2125 volts DC for one second. Still other standards, such as the CSA standard of Canada, require devices to withstand other levels of voltage for particular time increments. Specific parameters associated with the ground continuity test also vary among the different nations' standards.

Accordingly, in a manufacturing environment where different products are intended for export to different countries, testing a product for electrical safety compliance requires a labor intensive procedure of obtaining the applicable international standard, obtaining the test parameters associated with the applicable international standard, and performing the test on the device using the appropriate test parameters. Moreover, the test data must be recorded and associated with the device under test. Such activities are not only labor intensive, but furthermore require highly skilled operators who are knowledgeable about the products, their international markets, and the standards of various countries.

To assist in carrying out dielectric withstand tests and ground continuity tests, a dielectric tester known as the VITREK 944i Dielectric Analyzer has been developed, which is available from Vitrek Corporation of San Diego, Calif. The VITREK 944i Dielectric Analyzer (hereinafter "Vitrek Analyzer") performs AC and DC dielectric tests, ground continuity tests and other tests, based on input test parameters.

To alleviate the need for providing test parameters for each operation of a test, the Vitrek Analyzer allows a user to store up to ninety-nine test programs. To perform a particular test, the operator may select the appropriate one of the stored test programs through the keypad on the Vitrek Analyzer.

The Vitrek Analyzer also includes the ability to communicate with external devices, such as a general purpose computer. As discussed in the Vitrek 944i Dielectric Analyzer Operating and Maintenance Manual (Vitrek Corporation, 1994) (hereinafter "Vitrek Manual"), which is incorporated herein by reference, the Vitrek Analyzer allows individual tests to be configured and executed through an external communication link. In particular, the Vitrek Manual teaches that individual single step tests may be configured at a general purpose computer and then communicated to the Vitrek Analyzer. The Vitrek Manual also teaches that the Vitrek Analyzer may communicate test results over the communication link to an external device, such as general purpose computer.

While the Vitrek Analyzer provides a valuable tool for performing electrical safety compliance tests, the Vitrek Analyzer nevertheless has shortcomings. First, the user interface capabilities of the Vitrek Analyzer are limited. In particular, the stored test programs may only be accessed through the Vitrek Analyzer keypad by their two digit number. Thus, for example, if an operator stores several test programs in the Vitrek Analyzer, the operator must memorize or record on paper which test standard is associated with each stored test's two digit identification number. Moreover, the test programs stored in the Vitrek Analyzer may not be accessed through the communication link, or in other words, by an external computer. Thus, if the test programs stored in the Vitrek Analyzer are to be accessed, they must be accessed through operator input at the front panel of the Vitrek Analyzer, which, as discussed above, has extremely limited user interface capabilities.

Moreover, the Vitrek Manual does not teach a fully automated test system that is capable of performing tests that conform to the various nations' electrical safety compliance standards in an intuitive and straightforward manner. There is a need, therefore, for a fully automated test system that performs one of a plurality of electrical safety compliance tests with reduced labor effort and knowledge than that required by conventional test systems, including those taught by the Vitrek Manual. There is a further need for such a fully automated test system that is menu-driven, thereby reducing the complexity of operation of the system. There is yet a further need for a system that automatically obtains tracking identification data associated with each test performed by the automated test system.

SUMMARY OF THE INVENTION

The present invention fulfills the above needs, as well as others, by providing a test system that and method that allows an operator to select one of a plurality of product model identifiers through a user interface and cause a test apparatus, for example, the Vitrek Analyzer, to perform appropriate tests based on the operator selection. In other words, the operator merely identifies the type of product being tested, and the test system and method of the present invention automatically performs the appropriate tests. Accordingly, the operator need not know the particular test parameters or even the appropriate international standard to be applied. The ability to perform appropriate tests in an automated manner based on a selection of a product model identifier thus provides a highly automated, intuitive electrical safety compliance testing device.

In one embodiment, the present invention is an automated test system for testing a device that has a circuit connection and a ground connection. The automated test system includes a storage device, an input device, a processor, and a test apparatus. The storage device is operable to store a plurality of sets of test parameters, and is further operable to store a plurality of product model identifiers, each product model identifier associated with one of the plurality of sets of test parameters. The input device is operable to obtain input from an operator defining a first product model identifier from the plurality of product model identifiers. The processor is coupled to the input device and the storage device and is operable to receive the input from the input device and retrieve the set of test parameters associated with the first product model identifier from the storage device based on the input. The processor is further operable to generate a control signal that includes the retrieved set of test parameters. The test apparatus includes a first connection operable to be connected to the circuit connection of the device and a second connection operable to be connected to the ground connection of the device. The test apparatus is further operably connected to receive the control signal including the retrieved set of test parameters from the processor. The test apparatus is operable to perform a first test based on the first set of test parameters.

The use of the external processor, memory and user interface provides extensive user-interface and interconnection capabilities not found within the test apparatus itself. The automation and interconnection capabilities combined with the ability to select one of a plurality of test standards from the external user interface reduces the level of expertise require to perform the safety compliance tests as compared to the test systems taught by the prior art.

The above features and advantages, as well as others, will become more readily apparent to those of ordinary skill in the art by reference to the following detailed description and accompanying drawings.

DETAILED DESCRIPTION

Figure 1:
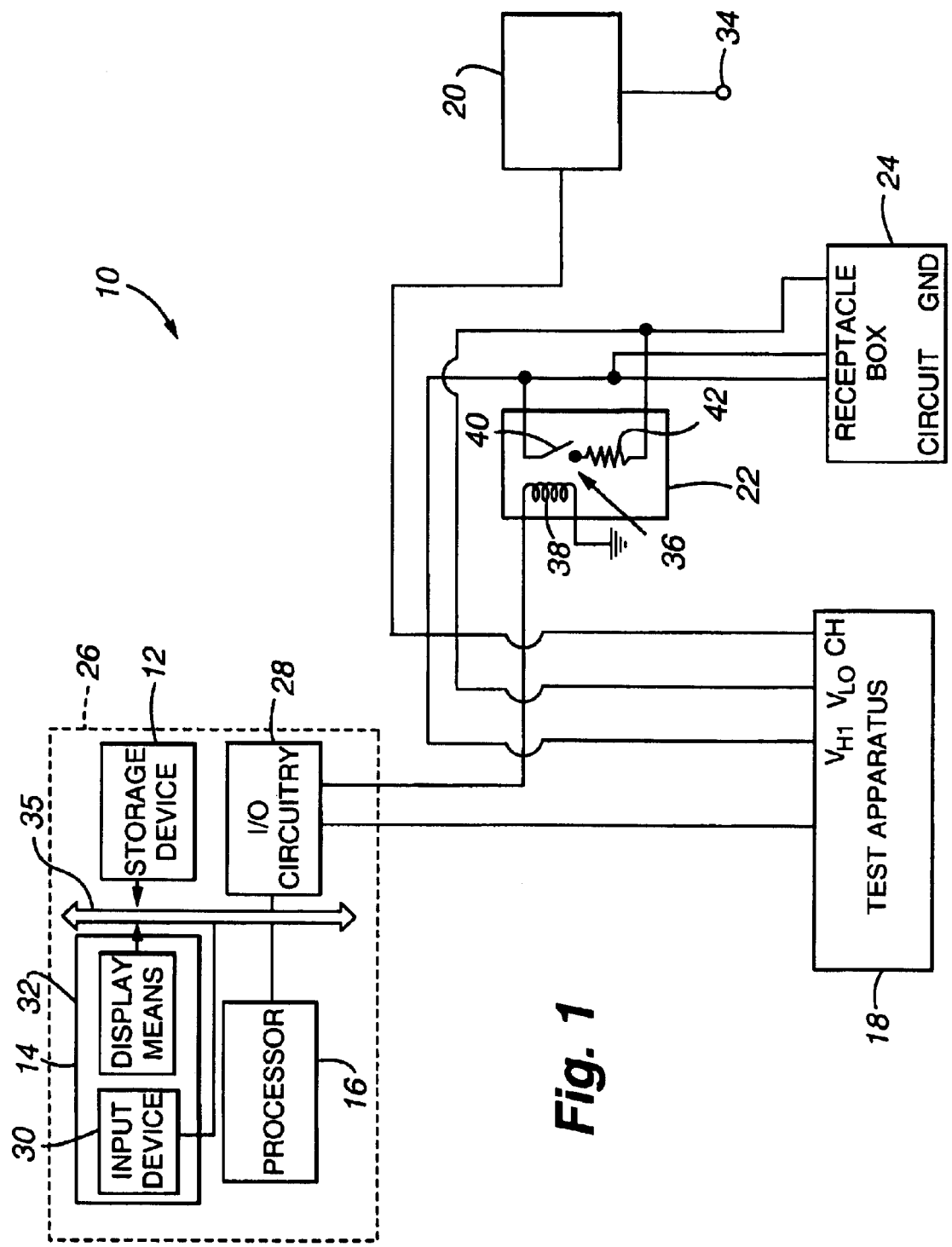
FIG. 1 shows an exemplary embodiment of an automated test system according to the present invention.

FIG. 1 shows an exemplary embodiment of an automated test system 10 according to the present invention. The automated test system 10 includes a storage device 12, a user interface 14, a processor 16, a test apparatus 18, a barrier circuit 20, a discharge circuit 22 and a receptacle box 24.

The storage device 12, the user interface 14 and the processor 16 are preferably integrated into a general purpose computer 26. The general purpose computer 26 further includes input/output ("I/O") circuitry 28 that provides an interface between the general purpose computer 26 and various external devices, including, but not limited to, the test apparatus 18 and the discharge circuit 22. To this end, the I/O circuitry 28 may suitably be one or more circuit cards designed to provide interface and/or communication circuitry that allow the general purpose computer 26 to communicate with the various external devices. Such devices are well known in the art. For example, in the embodiment described herein, the I/O circuitry 28 includes a IEEE-488-PCII card for interfacing to the test apparatus 18.

The storage memory 12 is one or more memory devices that are capable of storing data, and in particular, data identifying a plurality of sets of test parameters. A test parameter is a value defining an aspect of a test. A set of test parameters is a group of one or more test parameters. Each of sets of test parameters is associated with one or more of the products to be tested by the automated test system 10.

In accordance with the exemplary described herein, a set of test parameters includes the test parameters required for a dielectric withstand test and a ground continuity test. Moreover, each set of test parameters preferably includes test parameters for the dielectric withstand test and the ground continuity test as defined by a particular certification body. Table 1 below shows three sets of test parameters that may be stored in the memory 12 in an exemplary embodiment of the present invention. Table 1 further identifies the certification body to which the test parameters in each set corresponds.

TABLE 1

| Parameter | Set 1 | Set 2 | Set 3 |
| --- | --- | --- | --- |
| Dielectric Withstand Test | BABT | TUV | UL |
| AC voltage | 2800 | 2100 | 1500 |
| Duration of Application | 60 sec | 60 sec | 60 sec |
| Maximum Current | 40 ma | 40 ma | 40 ma |

TABLE 1-continued

| Parameter | Set 1 | Set 2 | Set 3 |
|---|---|---|---|
| Ground Continuity Test Maximum Resistance | BABT 0.1 Ohms | TUV 0.5 Ohms | UL 0.5 Ohms |

It will be appreciated that a particular product could require some test parameters from one certifying body and some test parameters of another certifying body. Accordingly, a hybrid set of test parameters that is defined by more than one certification body is possible. Moreover, certain product models may have unique product specific parameters that do not relate directly to a particular certifying body. In such a case, a set of test parameters would include those product-specific test parameters.

The storage device 12 is further operable to store a plurality of product model identifiers that correspond to each of the product types or models to be tested. Specifically, the automated test system 10 is intended for use in an environment in which several types of products are required to be tested. Each product type or model is identified by a product model identifier.

Each of the product model identifiers is associated with at least one of the sets of test parameters. In other words, for each product type or product model that is to be tested by the automated test system 10, one of the sets of test parameters will be applicable. In the exemplary embodiment described herein, the set of test parameters associated with each product model depends upon the country or countries in which the product type is intended to be sold. Thus, when the automated test system 10 is configured, each product type and the countries in which it is intended to be sold must be known.

For products intended for use in more than one country, the product model identifier is preferably associated with the set of test parameters that has the most stringent set of applicable test parameters. For example, if a product is intended for use in both the United Kingdom and the United States, its product model identifier as stored in the storage device 12 would be associated with the set of test parameters identified in Set 1 in Table 1. Set 1 consists of the BABT test parameters, applicable in the United Kingdom, which are more stringent than the corresponding UL test parameters identified in Set 3 in Table 1. The reason for using the most stringent set of applicable parameters is that the DUT need only pass the most stringent set of test parameters to obtain certification for all the countries in which it is intended to be sold.

In any event, to accomplish the above described storage functionality, the storage device 12 may suitably be any memory device ordinarily employed by general purpose computers and indeed may include a plurality of devices including separate nonvolatile and/or volatile storage devices, as is common in the art. It is noted that the storage device 12 is also operable to store test results and user input information.

The user interface 14 further comprises an input device 30 and a display means 32. The input device 30 may suitably be any combination of typical user input devices employed in general purpose computers. The input device 30 is operable to receive, among other things, product model identifiers. To this end, the input device 30 may include a keyboard, a mouse, a voice recognition system, or combinations of such devices that allow an operator to provide data input to the general purpose computer 26. The input device 30 may include, in addition to the elements described above, a bar code reading device and associated interface equipment. The inclusion of a bar code reading device may permit automation of several of the user input steps discussed further below.

The display means 32 is any device that renders computer data perceptible to a human operator. Such display means 32 may include cathode ray tubes, LCD displays, sound generation equipment and/or variations and combinations thereof.

The processor 16 may suitably be any processor employed in a general purpose computer. Such processors are well known. The processor 16, the storage device 12, the input device 30 and the display means 32 are all directly or indirectly interconnected through one or more digital busses illustrated in FIG. 1 as the bus 35.

The processor 16 is operable to receive input from the input device 30, including input identifying a product model identifier. The processor 16 is further operable to retrieve from the storage device 12 the set of test parameters associated with the product model identifier. The processor 16 is still further operable to generate a control signal that includes the retrieved set of test parameters, or at least information representative thereof.

The test apparatus 18 is a device operable to perform product testing by applying an input to a DUT and measuring a quantity from the DUT. In the exemplary embodiment described herein, the test apparatus 18 is an electrical safety compliance testing apparatus, such as the Vitrek Analyzer, that performs, among other things, dielectric withstand tests and ground continuity tests on DUTs. Preferably, the testing apparatus 18 performs product testing by receiving, through an input, certain test parameters, including parameters specifying the inputs to be applied to the DUT and acceptable threshold values of the measured quantities. The test apparatus 18 then applies the input and generates as output test results, which may be pass/fail information, actual measurement data, or both.

In addition, the test apparatus 18 in the preferred embodiment includes an automated safety circuit that stops testing operations when the test apparatus detects an unsafe condition. In particular, the test apparatus 18 preferably shuts down test operations if a discontinuity is detected between a ground connection of the DUT and a chassis connection of the DUT. Such a condition may indicate that the chassis of the DUT is not grounded, which may be a serious safety hazard. Such automated safety circuits are well known, and are included, for example, in the Vitrek Analyzer.

In any event, the test apparatus 18 is operably connected to receive the test parameters from, and to provide test results data to, the processor 16. To this end, the test apparatus 18 in the embodiment described herein is coupled to the processor 16 through the I/O circuitry 28 and communicates with the processor 16 over a I.E.E.E. 488 link 17. It will be appreciated, however, that the test apparatus 18 may be connected to the processor 16 via other types of communication links.

Figure 3:
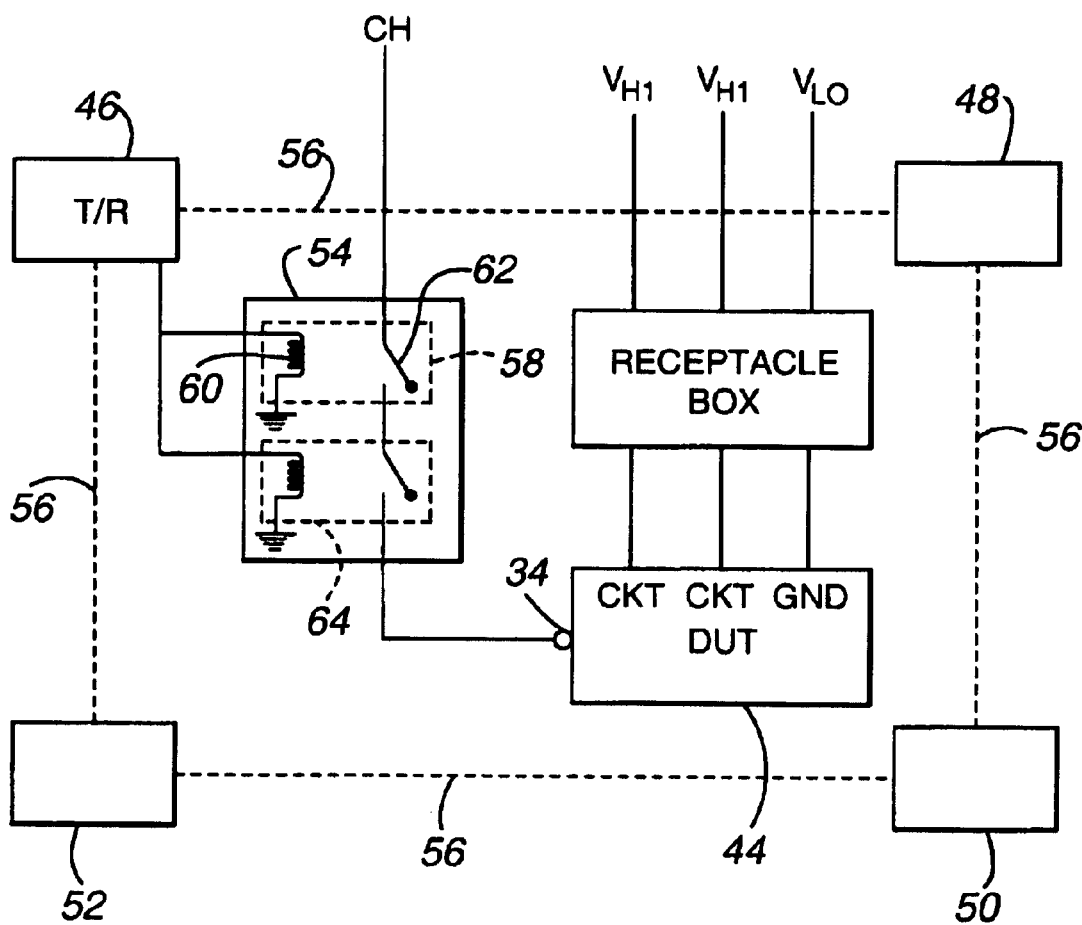
FIG. 3 shows an exemplary embodiment of a barrier circuit which may be employed in the automated test system of FIG. 1.

The test apparatus 18 of FIG. 1 includes three test connections, a VHI connection, a VLO connection, and a CH connection. The VHI and VLO connections are provided to the receptacle box 24. The CH connection is provided to the barrier circuit 20. The barrier circuit 20 includes a termination 34 that is normally electrically coupled to the CH connection. The termination 34 is configured to be coupled to the chassis of a DUT, not shown. FIG. 3, discussed further below, shows the interconnection of the CH connection, the barrier circuit 20, and a DUT 44.

Referring again to FIG. 1, the receptacle box 24 is a device that provides a junction between the VHI and VLO connections and the circuit and ground connections, respectively, of the DUT. In particular, as discussed above, consumer and industrial devices typically have a circuit connection through which external power received. Likewise, such devices typically have a ground connection. In most devices, the circuit connection constitutes two prongs of the power plug on the device and the ground connection constitutes the third prong of the power plug. Thus, to facilitate interconnection to the DUT, the receptacle box 24 includes one or more types of power plug receptacles adapted to receive standard plug configurations.

The test apparatus 18 is coupled to the receptacle box 24 such that the VHI connection may be coupled to both circuit connections of the DUT, thereby shorting both circuit connections of the DUT, and such that the VLO connection is coupled to the ground connection of the DUT.

The discharge circuit 22 is a circuit that, among other things, is operably connected to the processor 16 to receive a discharge control signal therefrom. The discharge circuit 22 is further operable to, responsive to the discharge control signal, provide a discharge path between the circuit connections and ground connection of the DUT. To this end, the discharge circuit 22 includes a relay 36 having a coil 38 and a contact 40. The contact 40 is connected at one end to the VHI connection and at the other end through a shunt resistor 42 to the VLO connection. The coil 38 is operably connected to the I/O circuitry 28 to receive the discharge control signal from the processor 16. The shunt resistor 42 is preferably a 32K ohm, 50 watt resistor. Such a resistor provides a lower time constant for discharge than that provided by typical discharge circuits within the test apparatus 18.

In a preferred embodiment, the relay 36 is a relay capable of carrying current in excess of 1 amp. To this end, the relay 36 may suitably be a 48 volt relay, wherein the coil 38 is further connected to a 48 volt power supply, not shown, through the I/O circuitry 28. The use of such a relay and the associated 48 volt power supply allows for the heavy duty operation required to perform the discharge operation in a safe manner.

The barrier circuit 20 is a circuit that is operable to detect movement in the vicinity of the DUT, not shown, and then cause the test apparatus 18 to stop performing a first test on the device upon detection of movement in the vicinity of the DUT.

In the exemplary embodiment described herein, the barrier circuit 20 includes one or more devices that form an optical perimeter around a location that includes the DUT. (See FIG. 3). The barrier circuit 20 is operable to cause interruption of a safety compliance test performed by the test apparatus 18 upon detecting movement of an object through the optical perimeter. To this end, the barrier circuit 20 in the embodiment described herein is connected between the CH connection of the test apparatus 18 and the chassis termination 34. The barrier circuit 20 is operable to disconnect the CH connection from the chassis termination 34 upon detection of the movement of an object through the optical perimeter, which causes the test apparatus 18 to detect a ground continuity failure and consequently stop any test pursuant to the operation of its automated safety circuits. More detail regarding the structure and operation of the barrier circuit 20 is described further below in connection with FIG. 3.

In the general operation of the automated test system 10, the operator ordinarily first connects a DUT to the automated test system 10. To this end, the operator couples the circuit and ground connections of the DUT to the receptacle box 24. In addition, the operator couples the termination 34 to the chassis of the DUT.

The general purpose computer 26 then, through the display means 32, provides the operator with a plurality of product model identifiers from which to choose for an upcoming test, wherein at least one of the product model identifiers corresponds to the DUT. The operator then, through the input device 30, selects the appropriate product model identifier and may further enter other information, such as a product serial number, operator name or the like.

The processor 16 then retrieves from the storage device 12 a set of test parameters associated with the product model identifier. As discussed above, the set of test parameters preferably includes parameters for a dielectric withstand test and a ground continuity test. Such test parameters are discussed in further detail below in connection with FIGS. 4 and 5.

Once the processor 16 retrieves the set of test parameters associated with the product model identifier, the processor 16 communicates the set of test parameters to the test apparatus 18. The test apparatus 18 then executes the tests in accordance with the set of test parameters, and reports the test results to the processor 16. The test results may suitably include pass/fail information, actual measurement data or both. The test results reporting capabilities of the test apparatus 18 may vary for different types of test apparatus, but most should include either pass/fail information or actual test measurements. The Vitrek Analyzer is operable to provide both types of test results. The processor 16 may in any event create a data file using the test results and any other relevant information, such as, for example, the product identification or serial number.

The processor 16 then, upon completion of the test, provides a discharge control signal to the discharge circuit 22, and in particular, to the coil 38 of the relay 36. Upon receiving the discharge control signal, the discharge circuit 22 causes immediate dissipation of any residual charge on the DUT. To this end, the discharge control signal energizes the coil 38, which, in turn, causes the contact 40 to close. When the contact 40 is closed, the VHI connection, which is connected to the circuit connection of the DUT, is shunted to the VLO connection, which is connected to the ground connection of the DUT, through the shunt resistor 42. The residual charge within the DUT then dissipates through the shunt resistor 42.

It is noted that the processor 16 is also programmed to cause operation of the discharge circuit 22 any time the test apparatus 18 stops a test operation, and not just upon successful completion of a test. Thus, for example, if the test apparatus 18 stops operations because of a detection of a breach of the optical perimeter by the barrier circuit 20, then the processor 16, which receives a signal from the test apparatus 18 indicating the stop of test operations, causes the discharge circuit 22 to dissipate the charge on the DUT.

In any event, the automated test system of the present invention thus provides an intuitive, easy to use test system for electrical safety compliance testing. In contrast to prior art systems, an operator using the present invention need not know the specific test parameters prescribed by the various international certifying bodies such as UL, CSA, BABT and others. In addition, the operator need not even know the countries in which certain products are intended to be sold. Accordingly, the present invention potentially reduces the training, labor and operational costs of electrical safety compliance testing. Moreover, the present invention further automates the test reporting process by employing the general purpose computer to generate data records including test results and other DUT and/or operator identification information.

Another advantage of the present invention is the safety and efficiency enhancements provided by the discharge circuit 22, described above. The discharge circuit 22 provides an automated discharge device that reduces the time required to discharge a DUT after being subjected to a high voltage test. Although test apparatus such as the Vitrek Analyzer will eventually dissipate residual charge on a DUT after a high voltage test, such dissipation is relatively slow. The present invention, by providing a relay and shunt resistor, can dissipate high residual charges quickly and safely. The reduced discharge time not only improves throughput, but also diminishes the likelihood that a human operator will contact a hazardously charged DUT.

Yet other advantages of the present invention are provided by the barrier circuit 20. As described above, the barrier circuit 20 is operable to stop operations of the automated test system 10 if movement is detected in the vicinity of the DUT. The barrier circuit 20 thus further enhances the safety of the operation of the automated test system. Moreover, the combination of the barrier circuit 20 and the discharge circuit 22 provide still further protection by automatically discharging a DUT upon movement of an object in the vicinity of the DUT.

FIG. 3 shows the an exemplary embodiment of the barrier circuit 20 according to the present invention. Also shown for contextual purposes in FIG. 3 is an exemplary DUT 44 and the receptacle box 24 from FIG. 1 connected for the automated performance of a dielectric withstand test and a ground continuity test. The exemplary barrier circuit 20 described herein includes an optical transceiver 46, a plurality of mirrors 48, 50 and 52, and a relay circuit 54.

The optical transceiver 46 is a device operable to transmit light or optical beams, and preferably infrared optical beams, and detect the reception of the same optical beam. The optical transceiver 46 is operable to generate at least one output signal, referred to herein as a detection signal, indicative of whether it is receiving the transmitted optical beam.

In the preferred embodiment, one or more such optical transceivers 46 generate a plurality of substantially vertically aligned beams to from an optical "fence". To this end, the optical transceiver 46 may suitably comprise a model P-4148B-2A-L1-15X-5R transmitter/receiver available from Scientific Technology, Inc. of Hayward Calif. The Scientific Technology, Inc. transmitter/receiver generates several vertically spaced optical beams and is operable to provide a detection signal indicating whether it is receiving all of the transmitted beams. Alternatively, one or more transceivers that transmit and detect reception of a single beam may be used as the optical transceiver 46. In addition, the use of an integrated transmitter/receiver is given by way of example, and those of ordinary skill in the art may readily employ one or more separate optical transmitters and optical receivers to perform the functions ascribed to the optical transceiver 46.

The plurality of mirrors 48, 50 and 52 are advantageously configured to reflect one or more optical beams transmitted by the optical transceiver 46 in a polygonal path to be received by the optical transceiver 46. The resulting polygonal path defines an optical perimeter 56 around a location that includes the DUT 44.

The relay circuit 54 preferably includes a first ground interrupt relay 58 comprising a coil 60 and a double pole, double throw switch contact 62. The coil 60 is operably connected to receive a signal indicating the status of the optical perimeter 56 from the transceiver 46. The status of the optical perimeter 56 is determined by whether the transceiver 46 is receiving all of the transmitted optical beams. When the transceiver 46 receives all of the transmitted optical beams, or in other words, the optical perimeter is intact, then the transceiver 46 provides a detection signal to the coil 60 that causes the switch contact 62 to be closed. Otherwise, when the transceiver 46 does not receive all of the transmitted optical beams, or in other words, if an object is breaching the optical perimeter 56, then the transreceiver 46 provides a detection signal to the coil 60 that causes the switch contact 62 to be open.

To this end, the switch contact 62 is connected to alternatively connect and disconnect the CH connection from the test apparatus 18 of FIG. 1 to the termination 34. The termination 34 is connected to the chassis of the DUT 44.

In the exemplary embodiment described herein, the relay circuit 54 further includes a second or redundant ground interrupt relay 64. The second ground interrupt relay 64 has the same structure and operation as the first ground interrupt relay 58 and provides redundancy of operation in case of a failure of the first ground interrupt relay 58.

In operation, the optical transceiver 46 transmits one or more optical or light beams and monitors for reception of the beams. The plurality of mirrors 48, 50 and 52 reflect the one or more light beams in a polygonal path around the DUT 44 such that the polygonal path terminates at the transceiver 46, thereby forming the optical perimeter 56 around the DUT 44. As long as nothing breaches the optical perimeter 56, the transceiver 46 receives all the transmitted light beams and provides a detection signal indicative thereof to the first and second ground continuity relays 58 and 64. That signal causes the switch contact 62 and the corresponding switch contact of the second ground continuity relay 64 to be closed.

Because the switch contacts of the ground continuity relays 58 and 64 are closed, the CH connection is electrically shorted to, or coupled to the chassis of the DUT 44. Under such conditions, the test apparatus 18 of FIG. 1 will perform the tests described above in connection with FIG. 1.

In particular, as discussed above, the test apparatus 18 has automated safety circuits that monitor for unsafe conditions, and in particular, for discontinuity between the ground connection and the chassis of the DUT 44. The test apparatus 18 monitors for discontinuity by measuring the resistance between the CH connection and the VLO connection. Thus, as long as the CH connection is shorted to the chassis of the DUT 44 and the chassis is internally coupled to the ground connection, the test apparatus 18 can start and continue test operations on the DUT 44. Accordingly, two conditions must be present for the test apparatus to perform tests: the DUT 44 must have at least some continuity between its ground connection and chassis; and the optical perimeter 56 must be intact and uncompromised.

If an object, for example, a person, breaches the optical perimeter 56, the transceiver 46 does not receive all the transmitted optical beams. When the transceiver 46 does not receive all the light beams, the transceiver provides a detection signal to the ground continuity relays 58 and 64 that cause them to disconnect the CH connection from the termination 34. As a result, the test apparatus 18 (FIG. 1) will detect a discontinuity from the CH connection to the VLO connection, and stop any testing (or prevent a new test) because of the detected discontinuity.

As a result, the barrier circuit 20 exploits the primitive automated safety capabilities of the test apparatus 18 by effectively "mimicking" a ground continuity failure when the optical perimeter 56 is breached. In particular, the barrier circuit 20 uses the relay 58 in the ground continuity circuit to cause the test apparatus 18 to detect a ground continuity failure when the optical perimeter 56 is compromised. The use of this inherent safety feature of the test apparatus for the unintended functionality described herein enables the barrier circuit 20 to be inexpensively and efficiently implemented.

Figure 4:
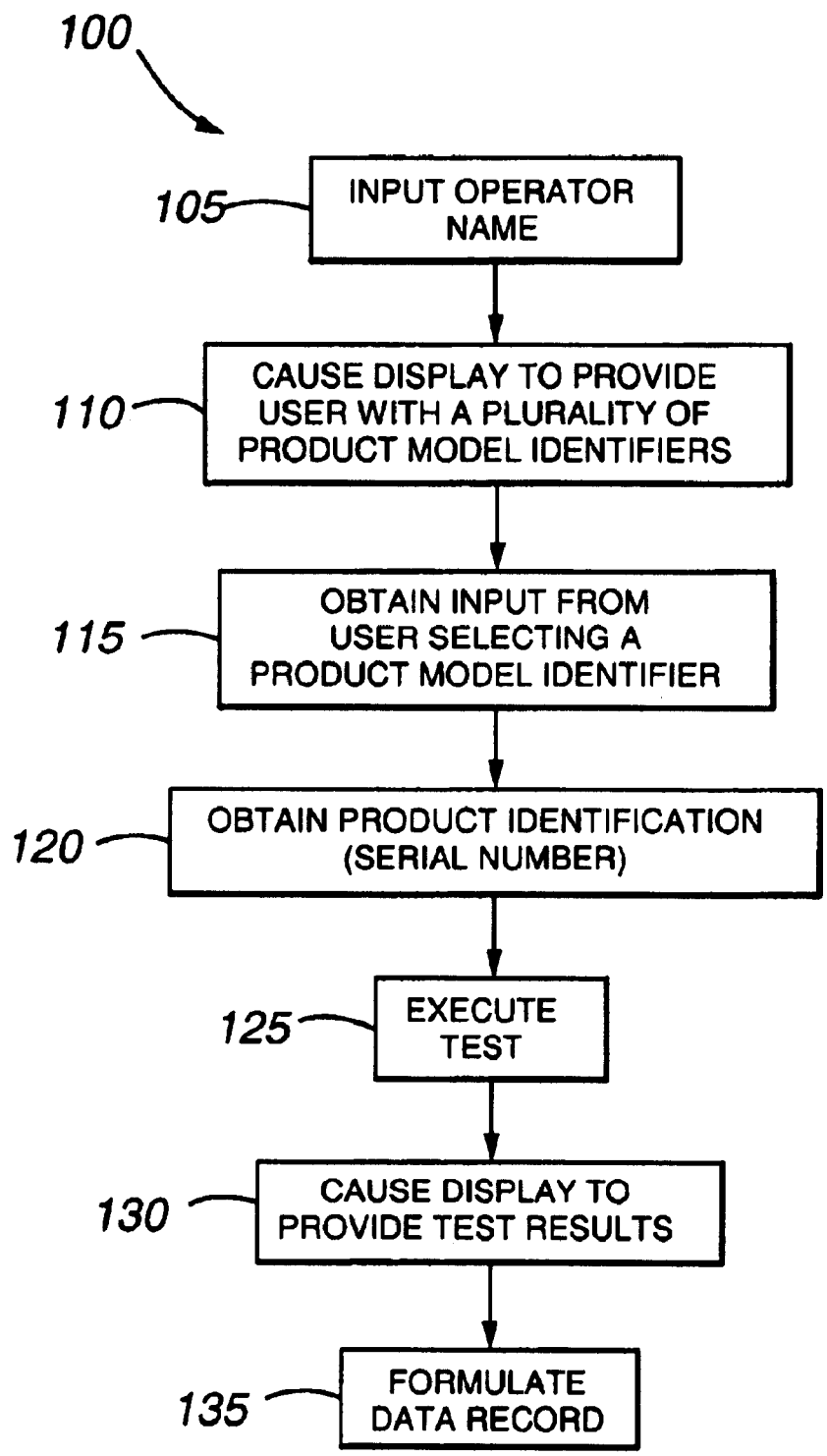
FIG. 4 shows a flow diagram of the main operation of the processor of the automated test system of FIG. 1.
Figure 5:
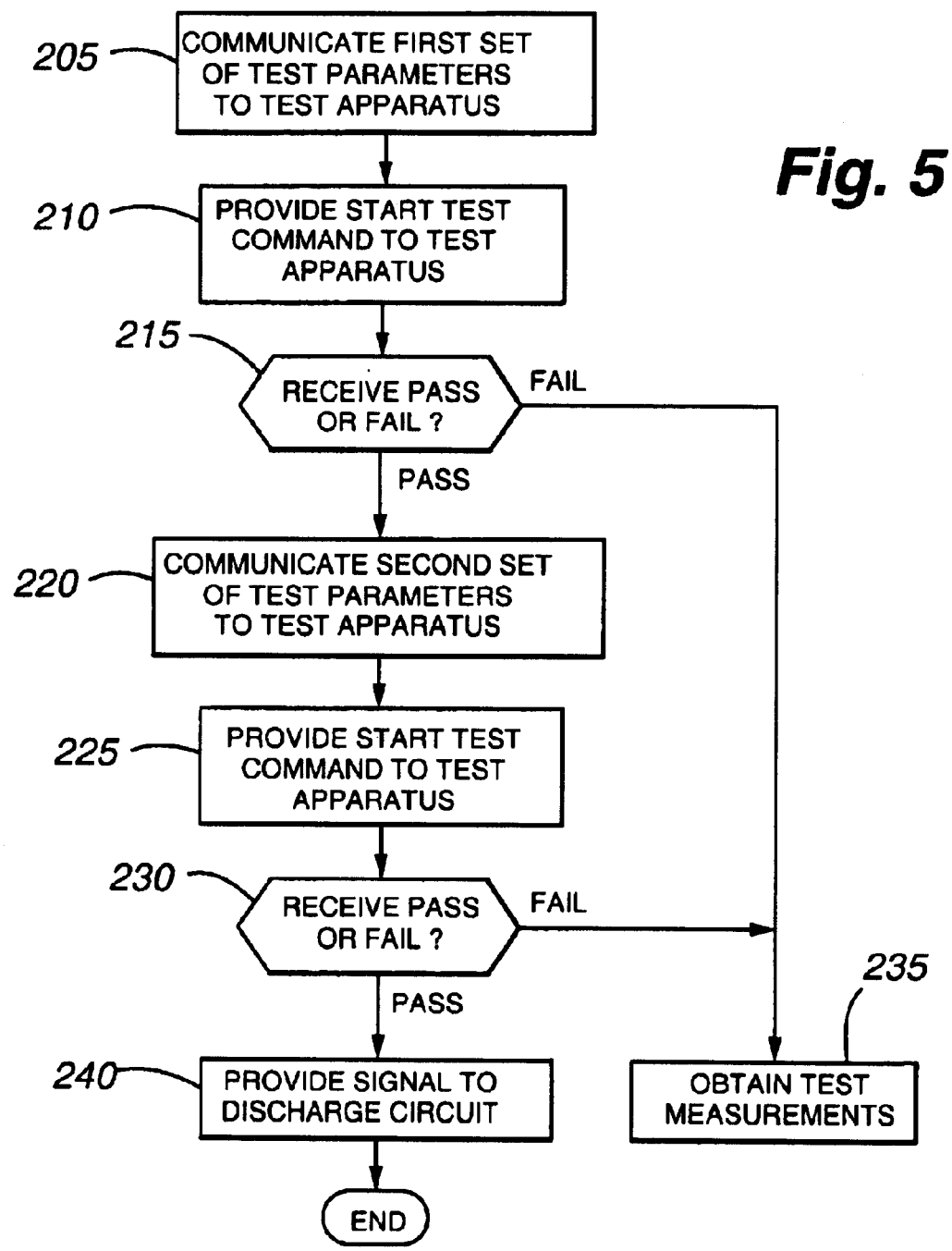
FIG. 5 shows a flow diagram of the test operations of the processor of the automated test system of FIG. 1.

Central to the automation features of the automated test system of the present invention is the operation of the processor 16 of FIG. 1. FIGS. 4 and 5 show exemplary flow diagrams of the operations of the processor 16 of FIG. 1 in carrying out a electrical safety compliance test according to the present invention. Specifically, FIG. 4 shows a flow diagram 100 of the main level program carried out by the processor 16 and FIG. 5 shows a flow diagram 200 of the operations carried out by the processor 16 in performing the "execute test" routine, or step 125 of the flow diagram 100 of FIG. 4. The operations shown in FIGS. 4 and 5 will be discussed with an ongoing reference to the elements shown in FIG. 1.

Referring to FIG. 4, the processor 16 in step 105 obtains input identifying the operator, such as, for example the operator's name. The operator's name may be required as part of the reporting or record keeping requirements of the relevant certifying agency. The processor 16 obtains the operator's identification and stores it in the storage device 12 for further use in step 135, discussed further below. After completion of step 105, the processor executes step 110.

Figure 2:
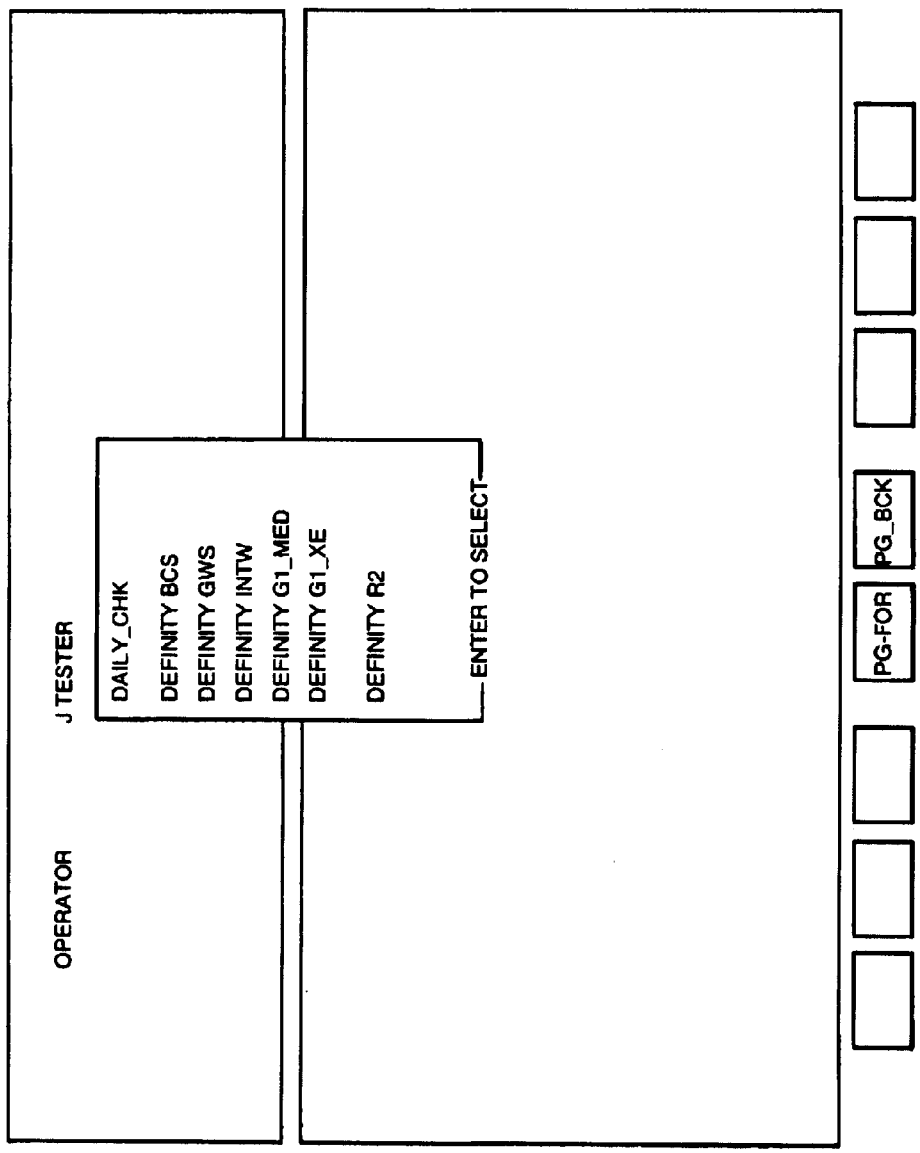
FIG. 2 shows a representation of an exemplary user interface screen that is used by the system in FIG. 1 to provide the operator with a plurality of product model identifier from which to choose.

In step 110, the processor 16 causes the display means 32 to display a plurality of product model identifiers and a prompt for the operator to select one of the product model identifiers. In the embodiment described herein, the product model identifiers are presented in a "menu" format. The product model identifiers are typically product model numbers or product names. For example, as shown in the exemplary display means menu of FIG. 2, the product model identifiers may suitably include "DEFINITY BCS", "DEFINITY GWS", "DEFINITY INTW" and "DEFINITY G1_MED".

Thereafter, in step 115, the processor 16 receives input from the input device identifying the appropriate product model identifier. To this end, the operator will have ascertained which of the product model identifiers describes the current DUT.

If a DUT is a product model for which the appropriate product model identifier is not displayed in step 110, then the operator may not be able to test the DUT using the automated test system 10 without modifying the automated test system 10. In particular, the data in the storage memory 12 would have to be modified to accommodate the new product model. In normal operation, however, the product model identifier will be displayed in step 110 and the operator will be able to select an appropriate product model identifier from the list in step 115

In an alternative embodiment, step 110 may be reconfigured to provide to operator with a selection of international standards, such as UL, CSA, BABT or the like, instead of product model identifiers. The operator would then select the appropriate country for the DUT in step 115. While such an alternative would encompass some of the advantages of the present invention, it nevertheless requires a higher level of knowledge about the product, and in particular, the countries in which it will be sold. Moreover, some knowledge of the testing standards of several countries would need to be known such that the operator may select the standard with the most stringent standards. Thus, while providing an operator with a selection of international standards (or country names) provides some of the automation advantages of the present invention, it does not provide the same level of simplicity as the preferred embodiment of steps 110 and 115 described above.

In any event, once the product model identifier is selected in step 115, the processor 18 then in step 120 obtains a product identification associated with the DUT. The product identification number is preferably a unique product identification number or alphanumeric string. Unlike the product model identifier wherein each product model identifier describes a type of product, the product identification is associate with a single product or device. To obtain the product identification, the input device 30 may include bar code scanning equipment to scan a bar code label on the DUT. In any event, the processor 18 then stores the product identification in the storage memory 12 for use in step 135, discussed further below.

It is noted, however, that in some cases, the product identification or serial number may inherently include a product model identifier. In such a case, steps 110 and 115 would not be necessary because the product model identifier would be provided in step 120.

After step 120, the processor 16 executes the test routine, represented in FIG. 4 as step 125. In general, the processor 16 causes the test apparatus 18 to perform one or more tests in accordance with a set of test parameters associated with the selected product model identifier. The processor 16 then receives the test results from the test apparatus. The test results may simply include pass/fail information, actual measurement results, or both. Further detail of the "execute test" routine of step 125 is provided in the flow diagram 200 of FIG. 5, discussed further below.

One the test has been executed, the processor 16 then executes step 130. In step 130, the processor 16 causes the display means 32 to display at least some indication of the test results received from the test apparatus 18 in step 125. The display of the test results provides feedback to the human operator so that the human operator may appropriately route the DUT based on the test results.

The processor 16 thereafter in step 135 formulates a data record using the test results and other data relating to the DUT. The data record preferably includes at least some of the test results, the product identification, and the operator identification. To this end, the processor 16 uses the test results provided by the test apparatus 18 in step 125, and retrieves from the storage device 12 the product identification and the operator identification. The resulting data record may then be stored or uploaded to a remote data base for subsequent reporting to the appropriate certification body and/or for general documentation of the test procedure.

Referring now to FIG. 5, step 125 is shown in detail as the flow diagram 200. In step 205, the processor 16 communicates a first subset of test parameters to the test apparatus 18. The first subset of test parameters are the test parameters for the ground continuity test. The main test parameters of the ground continuity test include the duration of the test and the maximum allowable resistance measured between the ground connection of the DUT and the chassis. The appropriate values for these parameters depend on the governing standard, for example, UL, CSA or BABT, and would be known or readily ascertainable by those of ordinary skill in the art. Communication of those parameters to the test apparatus 18 would be known to those of ordinary skill in the art. In the exemplary embodiment described herein wherein the test apparatus 18 is the Vitrek Analyzer, instructions for programming the processor 16 to configure the Vitrek Analyzer to perform ground continuity tests in accordance with specific test parameters through remote communications are provided on page 16 of the Vitrek Manual.

Once the processor 16 has communicated the first subset of test parameters to the test apparatus 18 in step 205, the processor 16 in step 210 provides a start test command to the test apparatus 18. The test apparatus 18 subsequently performs the ground continuity test in accordance with the first subset of test parameters and returns test results in the form of a pass/fail signal to the processor 16.

In step 215, the processor 16 determines whether it has received a pass or fail indication from the test apparatus 18. If the processor 16 determines that it has received a pass indication, it proceeds to step 220 to proceed with the dielectric withstand test. If, however, the processor determines that it has received a fail indication, then the processor proceeds to step 235.

In step 235, the processor 16 requests and receives additional test results in the form of actual test measurement values from the test apparatus 18. Thus, for example, if the ground continuity test failed, then the processor in step 235 obtains the measured resistance between the ground connection of the DUT and the chassis of the DUT for subsequent recording and analysis. After receiving the additional test results in step 235, the processor 16 in step 240 provides a signal to the discharge circuit 22 that causes the discharge circuit to dissipate any residual charge off of the DUT in the manner described above in connection with FIG. 1. After step 240, the test is terminated and the processor 16 proceeds as described above in connection with FIG. 4.

As evidenced above, if the DUT fails the ground continuity test, the processor 16 does not continue with the dielectric withstand test, but instead continues with the display and data record creation operations (steps 130 and 135) of FIG. 4. The reason that the processor 16 does not continue with the dielectric withstand test is that the failure of the ground continuity test can render the dielectric withstand test, which typically involves high and dangerous voltages, extremely hazardous.

Referring again to step 215, it is noted above that if the processor 16 determines that it has received a pass indication from the test apparatus 18 in connection with the ground continuity test, the processor 16 executes 220. In step 220, the processor 16 communicates a second subset of test parameters to the test apparatus 18. The second set of test parameters include the parameters for the dielectric withstand test. The main parameters of a dielectric withstand test include the type of voltage applied to the DUT, the quantity of voltage applied, the duration of the applied voltage, and the maximum allowable leakage current measured from the circuit connection to the ground connection of the DUT. Additional parameters for this test are identified in pages 43 and 44 of the Vitrek Manual. As with the ground continuity test, the values of the dielectric withstand test parameters for the various certifying agencies would be known to, or readily ascertainable by, those of ordinary skill in the art.

Once the processor 16 has communicated the second subset of test parameters to the test apparatus 18 in step 220, the processor 16 in step 225 provides a start test command to the test apparatus 18. The test apparatus 18 subsequently performs the dielectric withstand test in accordance with the second subset of parameters and returns test results in the form of a pass/fail signal to the processor 16. In performance of a dielectric withstand test, the test apparatus 18 applies a high voltage (defined by the test parameters) across the circuit connection and ground connection of the DUT through the VHI and VLO connections. The test apparatus 18 then measures the current flow from the circuit connection and ground connection to determine whether the isolation of the ground connection is sufficient.

In step 230, the processor 16 determines whether it has received a pass or fail indication from the test apparatus 18. If the processor 16 determines that it has received a pass indication, it proceeds directly to step 240 to proceed with providing the discharge control signal to the discharge circuit 22 to dissipate the residual charge on the DUT. If, however, the processor 16 determines that it has received a fail indication, then the processor proceeds first to step 235 to obtain additional test results including the actual test measurements. Thereafter, the processor 16 proceeds to step 240 and proceeds accordingly.

It will be noted that the embodiments described above are merely exemplary, and that those of ordinary skill in the art may readily devise their own implementations that incorporate the principles of the present invention and fall within the spirit and scope thereof.

For example, the use of an optical perimeter in the barrier circuit 20 is given by way of example only. At least some of the advantages of the present invention may be accomplished by other devices that detect movement or proximity of people near the DUT. Such devices may suitably replace the optical transceiver 46 and mirrors of the barrier circuit 20 disclosed herein. Moreover, the relay circuit 54 may suitably be replaced by other control devices that cause the test apparatus 18 to stop operating upon receipt of a detection signal indicating that the optical perimeter has been breached. In one alternative embodiment, the control device may suitably be the processor 16. In such a case, the optical transceiver 46 would provide the detection signal to the processor 16 through the I/O circuitry 28 and the processor 16 would provide control signals to the test apparatus 18 causing it to stop operations if the detection signal indicates that the optical perimeter 56 has been compromised.

We claim:

1. A method of testing a device using a test apparatus, the device having a circuit connection and a ground connection, the test apparatus operable to generate voltages at select levels and for select times based on test parameters, the method comprising:
   a) obtaining input from an operator defining a first product model identifier from a plurality of product model identifiers;
   b) retrieving from a memory one of the plurality of sets of test parameters associated with the first product model identifier;
   c) causing the test apparatus to execute a first test based on the retrieved set of test parameters by providing a control signal to the test apparatus over a communication link; and
   d) obtaining test results from the test apparatus.

2. The method of claim 1 wherein step a) further comprises providing in a user interface the plurality of product model identifiers for selection by the operator, each product model identifier associated with one of the plurality of sets of test parameters.

3. The method of claim 1 wherein step a) further comprises providing in the user interface the plurality of product model identifiers for selection by an operator, each product model identifier associated with one of the plurality of sets of test parameters, wherein each of the plurality of sets of test parameters comprises a set of test parameters associated with one of a plurality of international standards.

4. The method of claim 2 wherein step d) further comprises obtaining test results comprising measurement data relating to a current measurement.

5. The method of claim 1 further comprising the steps of:
obtaining an identification associated with the device; and
creating a data record comprising the identification and the test results.

6. The method of claim 1 wherein step c) further comprises causing the test apparatus to execute a first test based on the plurality of test parameters, wherein executing the first test includes applying a first voltage across the circuit connection and the ground connection and performing a current measurement thereon.

7. The method of claim 6 wherein step c) further comprises causing the test apparatus to execute a second test based on the plurality of test parameters, the second test including measuring the resistance between the ground connection and a chassis connection point on the device.

8. An automated test system for testing a device, the device having a circuit connection and a ground connection, the automated test system comprising:
a storage device operable to store a plurality of sets of test parameters, the storage device further operable to store a plurality of product model identifiers, each product model identifier associated with one of the plurality of sets of test parameters;
an input device for obtaining input from an operator defining a first product model identifier from the plurality of product model identifiers;
a processor, coupled to the input device and the storage device, operable to receive the input from the input device and retrieve the set of test parameters associated with the first product model identifier from the storage device based on the input; the processor further operable to generate a control signal that includes the retrieved set of test parameters, the processor further operable to generate a discharge control signal upon completion of a test;
a test apparatus further comprising a first connection operable to be connected to the circuit connection of the device and a second connection operable to be connected to the ground connection of the device, the test apparatus further operably connected to receive the control signal including the retrieved set of test parameters from the processor, the test apparatus operable to perform a first test based on the first set of test parameters;
a barrier circuit operable to detect movement in the vicinity of the device, the barrier operably connected to cause the test apparatus to stop performing a first test on the device upon detection of movement in the vicinity of the device; and
a discharge circuit coupled to the processor and operable to be coupled to the ground connection and the circuit connection of the device; the discharge circuit including a shunt resistor, the discharge circuit operable to connect the discharge circuit between the ground connection and the circuit connection upon receipt of a discharge control signal from the processor.

9. The system of claim 8 wherein the test apparatus is further operably connected to obtain test measurement data.

10. The system of claim 9 wherein the test apparatus is further operably connected to provide a test result signal including information representative of the test measurement data to the processor.

11. The system of claim 10 further comprising a display connected to the processor, the display operable to display information based on said information representative of the test measurement data.

12. The system of claim 10 wherein the input device is further operable to obtain an identification associated with the device, and wherein the processor is further operable to generate a data file based on the information representative of the test measurement data and associated with said identification.

* * * * *